United States Patent
Wu et al.

(10) Patent No.: US 12,249,566 B1
(45) Date of Patent: Mar. 11, 2025

(54) 3DIC WITH GAP-FILL STRUCTURES AND THE METHOD OF MANUFACTURING THE SAME

(71) Applicant: Taiwan Semiconductor Manufacturing Co., Ltd., Hsinchu (TW)

(72) Inventors: Ping-Jung Wu, Hsinchu (TW); Ken-Yu Chang, Hsinchu (TW); Hao-Wen Ko, Hsinchu (TW); Tsang-Jiuh Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/516,039

(22) Filed: Nov. 21, 2023

Related U.S. Application Data

(60) Provisional application No. 63/520,705, filed on Aug. 21, 2023.

(51) Int. Cl.
| | | |
|---|---|---|
| *H01L 23/48* | (2006.01) | |
| *H01L 21/768* | (2006.01) | |
| *H01L 23/498* | (2006.01) | |
| *H01L 23/538* | (2006.01) | |
| *H01L 27/06* | (2006.01) | |

(52) U.S. Cl.
CPC .. *H01L 23/49827* (2013.01); *H01L 21/76837* (2013.01); *H01L 21/76843* (2013.01); *H01L 23/5384* (2013.01); *H01L 27/0688* (2013.01)

(58) Field of Classification Search
CPC ........... H01L 23/49827; H01L 23/5384; H01L 21/76837; H01L 21/76843
USPC ................................ 257/774; 438/637, 639
See application file for complete search history.

(56) References Cited

U.S. PATENT DOCUMENTS

| | | | | |
|---|---|---|---|---|
| 5,353,498 A | * | 10/1994 | Fillion | H01L 23/293 |
| | | | | 257/E23.092 |
| 5,725,909 A | * | 3/1998 | Shaw | B05D 3/144 |
| | | | | 427/255.6 |
| 6,130,823 A | * | 10/2000 | Lauder | H01L 25/105 |
| | | | | 361/764 |
| 8,115,292 B2 | * | 2/2012 | Toh | H01L 23/3128 |
| | | | | 257/777 |
| 11,664,336 B2 | | 5/2023 | Chen et al. | |
| 11,715,696 B2 | * | 8/2023 | Sheng | H01L 24/73 |
| | | | | 257/774 |

(Continued)

FOREIGN PATENT DOCUMENTS

TW 202109804 A 3/2021

*Primary Examiner* — Nitin Parekh
(74) *Attorney, Agent, or Firm* — Slater Matsil, LLP

(57) ABSTRACT

A method includes bonding a top die to a bottom die, depositing a first dielectric liner on the top die, and depositing a gap-fill layer on the first dielectric liner. The gap-fill layer has a first thermal conductivity value higher than a second thermal conductivity value of silicon oxide. The method further includes etching the gap-fill layer and the first dielectric liner to form a through-opening, wherein a metal pad in the bottom die is exposed to the through-opening, depositing a second dielectric liner lining the through-opening, filling the through-opening with a conductive material to form a through-via connecting to the metal pad, and forming a redistribution structure over and electrically connecting to the top die and the through-via.

20 Claims, 15 Drawing Sheets

(56) References Cited

U.S. PATENT DOCUMENTS

| | | | |
|---|---|---|---|
| 2004/0188819 A1* | 9/2004 | Farnworth | B33Y 70/00 |
| | | | 257/E21.705 |
| 2009/0261466 A1* | 10/2009 | Pagaila | H01L 24/86 |
| | | | 257/737 |
| 2011/0195546 A1* | 8/2011 | Yang | H01L 24/82 |
| | | | 438/118 |
| 2015/0011083 A1* | 1/2015 | Tsai | H01L 23/481 |
| | | | 438/631 |
| 2016/0079196 A1* | 3/2016 | Teh | H01L 24/25 |
| | | | 257/773 |
| 2017/0098629 A1* | 4/2017 | Liu | H01L 24/20 |
| 2019/0139935 A1* | 5/2019 | Chen | H01L 21/8221 |
| 2021/0202463 A1* | 7/2021 | Chen | H01L 21/6835 |
| 2022/0002608 A1* | 1/2022 | Ebitani | B32B 27/20 |
| 2022/0093571 A1 | 3/2022 | Chen et al. | |
| 2022/0208650 A1 | 6/2022 | Gao et al. | |
| 2022/0359377 A1* | 11/2022 | Yu | H01L 33/38 |

* cited by examiner

3DIC WITH GAP-FILL STRUCTURES AND THE METHOD OF MANUFACTURING THE SAME

PRIORITY CLAIM AND CROSS-REFERENCE

This application claims the benefit of the following provisionally filed U.S. Patent application: Application No. 63/520,705, filed on Aug. 21, 2023, and entitled "3DIC Semiconductor Device and Method of Manufacturing the Same," which application is hereby incorporated herein by reference.

BACKGROUND

Integrated circuit packages may have a plurality of package components such as device dies and package substrates bonded together to increase the functionality and integration level. Heat dissipation has become a severe issue due to the high integration level. In addition, due to the differences between different materials of the plurality of package components, warpage may occur. The warpage may cause non-bond issues, and some conductive features that are intended to be bonded to each other are not bonded, resulting in circuit failure. These issues need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
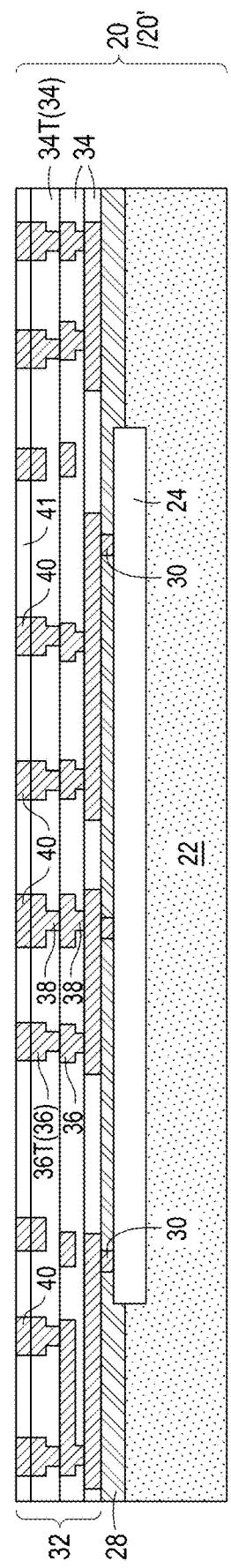
FIGS. 1-12 illustrate a process for forming a package with improved gap-fill structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming a package with the gap-fill regions having improved heat-dissipation ability and the resulting structures are provided. The heat generated by device dies may dissipate through the gap-fill regions. The stress and the warpage in the resulting package may also be reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 12 illustrate the cross-sectional views of intermediate stages in the formation of a package in accordance with some embodiments of the present disclosure. The corresponding processes are also reflected schematically in the process flow shown in FIG. 15.

Figure 15:
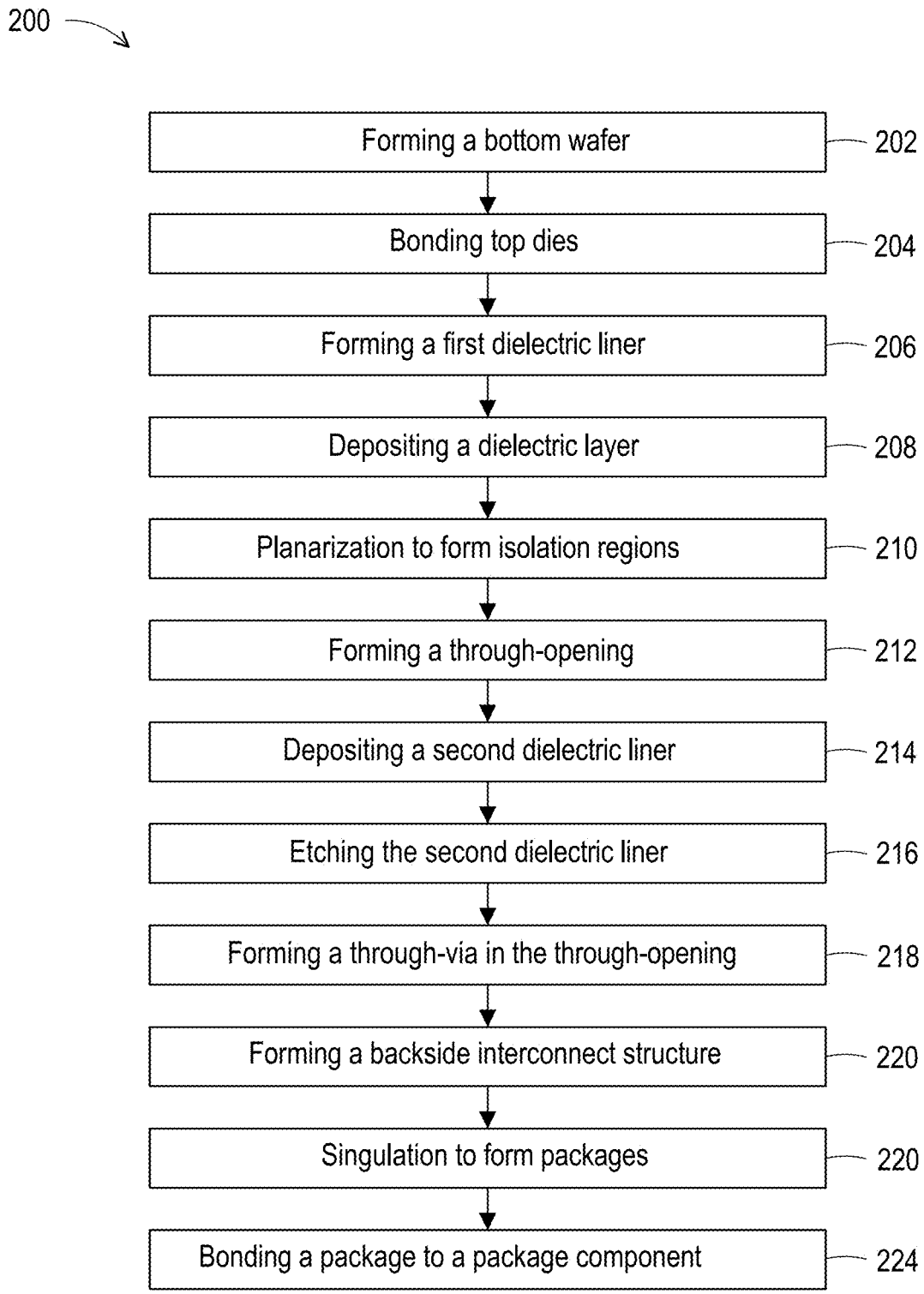
FIG. 15 illustrates a process flow for forming a package in accordance with some embodiments.

FIG. 1 illustrates a cross-sectional view in the formation of package component 20. The respective process is illustrated as process 202 in the process flow 200 as shown in FIG. 15. In accordance with some embodiments, package component 20 is a device wafer, which includes device dies 20' therein. Device dies 20' may include active devices and possibly passive devices, which are represented as integrated circuit devices 24. In accordance with alternative embodiments, package component 20 is an interposer die, which is free from active devices, and may or may not include passive devices. In accordance with yet alternative embodiments, package component 20 is or comprises a package such as an Integrated Fan-Out (InFO) Package, a redistribution structure including redistribution lines therein, or the like.

In accordance with some embodiments, package component 20 includes semiconductor substrate 22 and the features formed over semiconductor substrate 22. Semiconductor substrate 22 may be formed of or comprise crystalline silicon, crystalline germanium, crystalline silicon germanium, carbon-doped silicon, a III-V compound semiconductor, or the like. Semiconductor substrate 22 may also be a bulk semiconductor substrate or a Semiconductor-On-Insulator (SOI) substrate.

In accordance with some embodiments, package component 20 includes integrated circuit devices 24, which are formed at the top surface of semiconductor substrate. Integrated circuit devices 24 may include Complementary Metal-Oxide Semiconductor (CMOS) transistors, resistors, capacitors, diodes, and/or the like in accordance with some embodiments. The details of integrated circuit devices 24 are not illustrated herein.

Inter-Layer Dielectric (ILD) 28 is formed over semiconductor substrate 22 and fills the spaces between the gate stacks of transistors (not shown) in integrated circuit devices 24. In accordance with some embodiments, ILD 28 is formed of silicon oxide, Phospho Silicate Glass (PSG), Boro Silicate Glass (BSG), Boron-doped Phospho Silicate Glass (BPSG), Fluorine-doped Silicate Glass (FSG), or the like. ILD 28 may be formed using spin-on coating, Flowable Chemical Vapor Deposition (FCVD), or the like. In accordance with some embodiments, ILD 28 may also be formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 24 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Interconnect structure 32 is formed over semiconductor substrate 22. In accordance with some embodiments, interconnect structure 32 includes a plurality of dielectric layers 34, and a plurality of conductive features such as metal lines/pads 36 and vias 38 in the dielectric layers 34.

Dielectric layers 34 may include low-k dielectric layers (also referred to as Inter-metal Dielectrics (IMDs)) in accordance with some embodiments. The dielectric constants (k values) of the low-k dielectric layers may be lower than about 3.5 or 3.0, for example. The low-k dielectric layers may comprise a carbon-containing low-k dielectric material, Hydrogen SilsesQuioxane (HSQ), MethylSilsesQuioxane (MSQ), or the like.

The formation of metal lines 36 and vias 38 in dielectric layers 34 may include single damascene processes and/or dual damascene processes. In a single damascene process for forming a metal line or a via, a trench or a via opening is first formed in one of dielectric layers 34, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 36 include top conductive (metal) features (denoted as 36T) such as metal lines, metal pads, or vias in a top dielectric layer (denoted as dielectric layer 34T), which is the top layer of dielectric layers 34. In accordance with some embodiments, dielectric layer 34T is formed of a low-k dielectric material similar to the material of lower ones of dielectric layers 34. The metal features 36T in the top dielectric layer 34T may also be formed of copper or a copper alloy, and may have a dual damascene structure or a single damascene structure.

Interconnect structure 32 may also include a passivation layer (not shown), which is over, and may be in contact with, an underlying dielectric layer 34. The passivation layer may be formed of a non-low-k dielectric material, which may comprise silicon and another element(s) including oxygen, nitrogen, carbon, and/or the like. The material of the passivation layer may be expressed as $SiO_xN_yC_z$, with x being in the range between about 0 and about 2, y being in the range between about 0 and about 1.33, and z being in the range between about 0 and about 1, and x, y, and z will not be all equal to zero. For example, the passivation layer may be formed of or comprises SiON, SiN, SiOCN, SiCN, SiOC, SiC, or the like.

Bond layer 41 and bond pads 40 are formed as a top portion of interconnect structure 32. Bond layer 41 may be formed of a silicon-containing dielectric material selected from SiO, SiC, SiN, SION, SiOC, SiCN, SiOCN, or the like, or combinations thereof. Bond pads 40 may comprise copper, and may be formed through a damascene process. The bond layer 41 and bond pads 40 are planarized so that their top surfaces are coplanar, which may be resulted due to a Chemical Mechanical Polish (CMP) process performed in the formation of bond pads 40.

Figure 2:
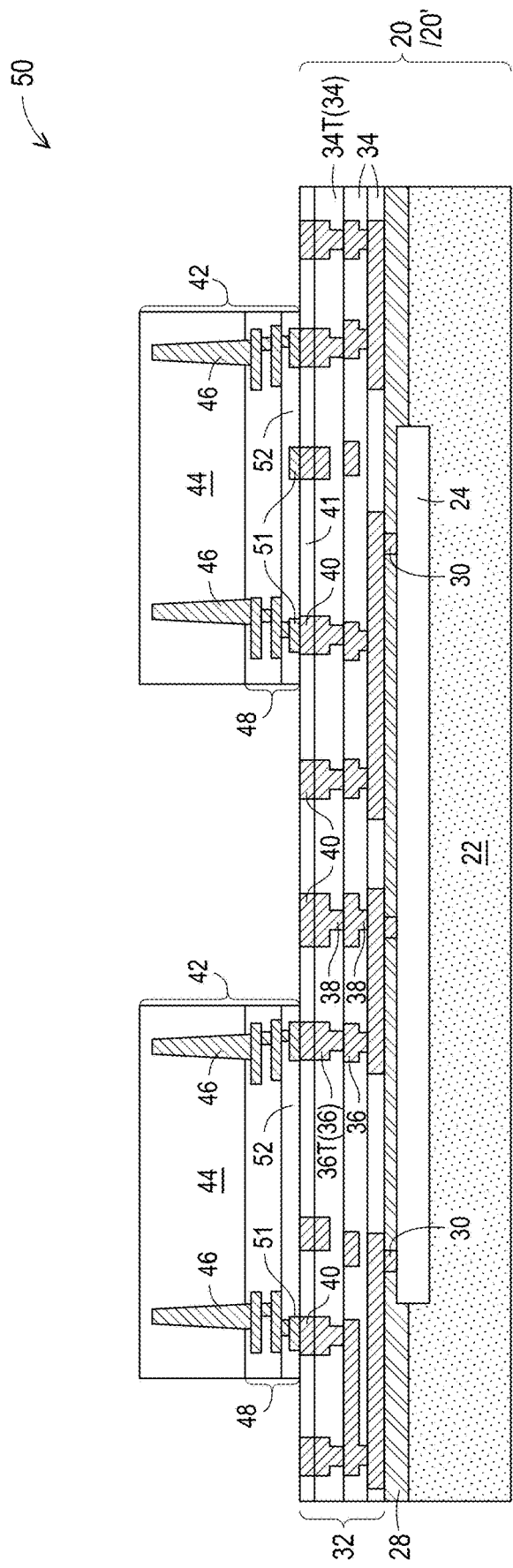

Referring to FIG. 2, device dies 42 (also referred to as top dies) are bonded to the device dies 20' (also referred to as bottom dies) in package component 20. The respective process is illustrated as process 204 in the process flow 200 as shown in FIG. 15. In accordance with some embodiments, each of device dies 42 may be a logic die, which may be a Central Processing Unit (CPU) die, a microcontroller (MCU) die, an input-output (IO) die, a BaseBand die, or the like. Device dies 42 may also include memory dies.

Device dies 42 may include semiconductor substrates 44. Through-Silicon Vias (TSVs) 46, sometimes referred to as through-semiconductor vias or through-vias, are formed to extend into semiconductor substrates 44. TSVs 46 are used to connect the integrated circuit devices and metal lines formed on the front side (the illustrated bottom side) of semiconductor substrates 44 to the backside, and connect device die 20' to a subsequently formed redistribution structure. Also, device dies 42 include interconnect structures 48 for connecting to the active devices and passive devices in device dies 42. Interconnect structures 48 include metal lines and vias.

Each of device dies 42 includes bond pads 51 and bond layer 52 (also referred to as a bond film) at the illustrated bottom surface of device die 42. The bottom surfaces of bond pads 51 may be coplanar with the bottom surface of bond layer 52. In accordance with some embodiments, Bond layer 52 may be formed of a silicon-containing dielectric material, which may be selected from SiO, SiC, SiN, SiON, SiOC, SiCN, SiOCN, or the like, or combinations thereof. Bond pads 51 may comprise copper, and may be formed through a damascene process. The bond layer 52 and bond pads 51 are planarized so that their surfaces are coplanar, which may be resulted due to the CMP in the formation of bond pads 51.

The bonding may be achieved through hybrid bonding. For example, bond pads 51 are bonded to bond pads 40 through metal-to-metal direct bonding. In accordance with some embodiments, the metal-to-metal direct bonding is copper-to-copper direct bonding. Furthermore, bond layers 52 are bonded to bond layer 41 through fusion bonding, for example, with Si—O—Si bonds being generated. The structure illustrated in FIG. 2 is referred to as reconstructed wafer 50 hereinafter, and more features are subsequently formed to further expand the reconstructed wafer 50 in subsequent processes.

In accordance with some embodiments, a backside grinding process may be performed to thin device dies 42. Through the thinning of device dies 42, the aspect ratio of the gaps between neighboring device dies 42 is reduced in order to perform gap filling. Otherwise, the gap filling may be difficult due to the otherwise high aspect ratio of the gaps. After the backside grinding process, TSVs 46 may be revealed. Alternatively, TSVs 46 are not revealed at this time, and the backside grinding is stopped when there is a thin layer of substrate covering TSVs 46. In accordance with these embodiments, TSVs 46 may be revealed in the step shown in FIG. 5.

Figure 3:
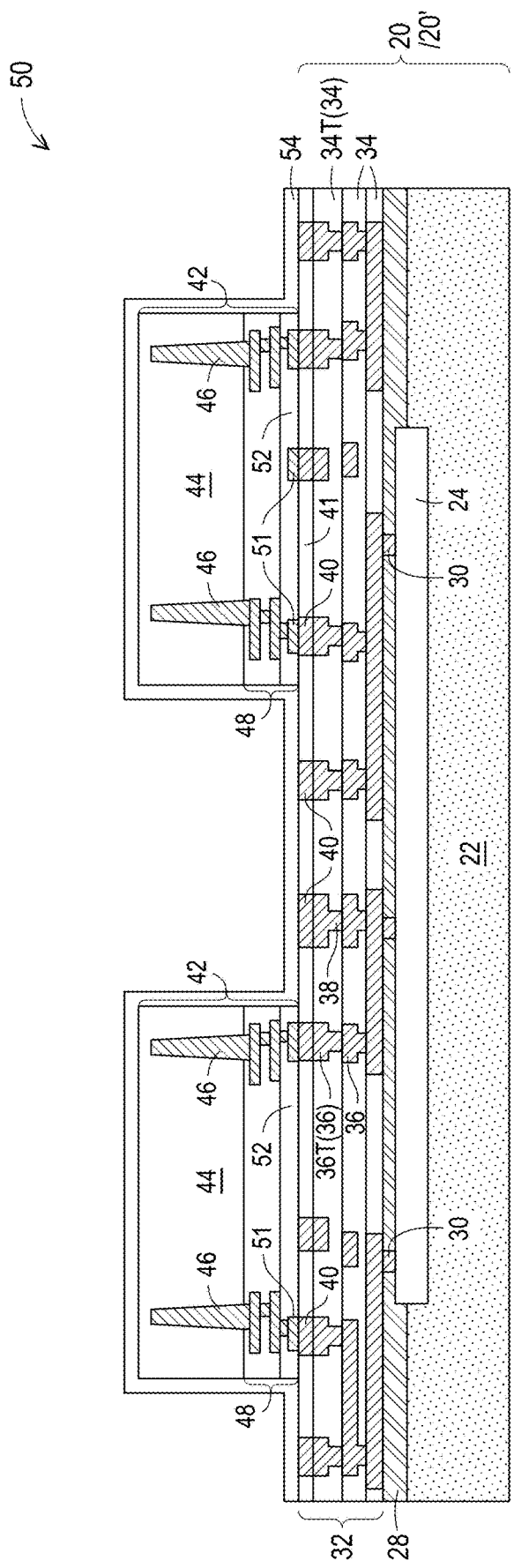
Figure 4:
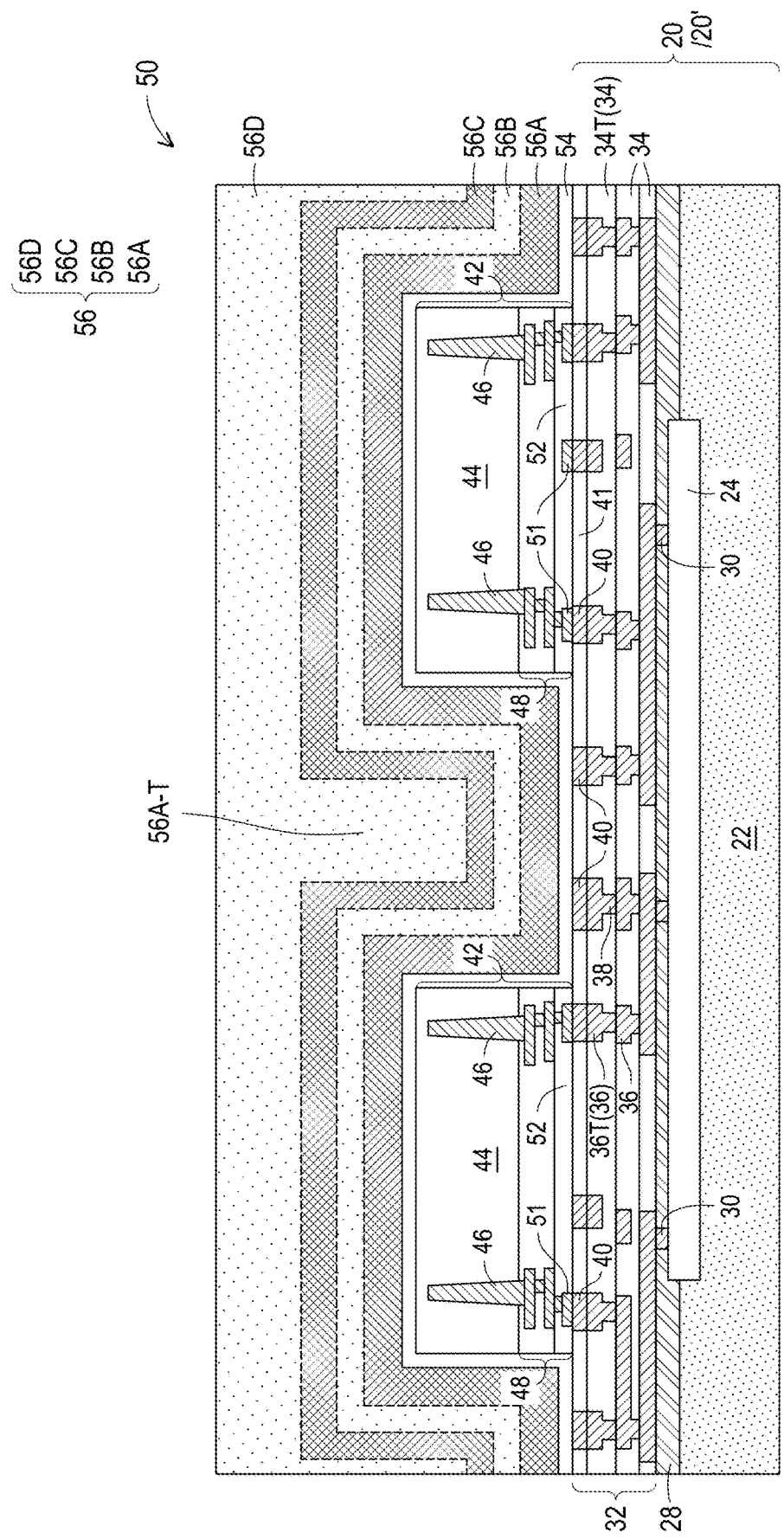

FIGS. 3 and 4 illustrate the formation of a plurality of gap-fill layers. In accordance with some embodiments, the gap-fill layers include dielectric liner 54, and gap-fill layer 56 over and contacting dielectric liner 54.

Referring to FIG. 3, dielectric liner 54 is deposited. The respective process is illustrated as process 206 in the process flow 200 as shown in FIG. 15. Dielectric liner 54 may be deposited using a conformal deposition method such as Atomic Layer Deposition (ALD) or Chemical Vapor Deposition (CVD). Dielectric liner 54 is formed of a dielectric material that has good adhesion to the sidewalls of device dies 42 and the top surfaces of bond layer 41 and bond pads 40. In accordance with some embodiments, dielectric liner 54 is formed of a nitride-containing material such as silicon nitride, SiON, SiCN, or the like. Dielectric liner 54 extends on, and contacts, the sidewalls of device dies 42.

FIG. 4 illustrates the formation of gap-fill layer 56 over and contacting dielectric liner 54. The respective process is illustrated as process 208 in the process flow 200 as shown in FIG. 15. The thermal conductivity of gap-fill layer 56 is higher than the thermal conductivity of silicon oxide. For example, the thermal conductivity of silicon oxide may be in the range between about 1.1 watt/m-k and about 1.3 watt/m-k. Accordingly, the thermal conductivity of gap-fill layer 56 may be equal to or higher than about 1.5 watt/m-k, and may be in the range between about 1.5 watt/m-k and about 500 watt/m-k.

In accordance with some embodiments, gap-fill layer 56 is a single layer, with an entirety of the gap-fill layer 56 being formed of a homogeneous material. The material of gap-fill layer 56 is different from the material of dielectric liner 54. In accordance with some embodiments, gap-fill layer 56 is formed of a semiconductor material such as silicon, III-V semiconductor, or the like. When silicon is used, gap-fill layer 56 is formed of amorphous silicon, which may be undoped with any of the p-type and n-type impurity, and thus is intrinsic. Accordingly, gap-fill layer 56 is intrinsic. This will keep the electrical conductivity value of gap-fill layer 56 low, and hence the leakage current through gap-fill layer 56 to be low.

The amorphous silicon may have a thermal conductivity of about 1.8 watt/m-k, which is significantly greater than the thermal conductivity of silicon oxide. In accordance with alternatively embodiments, gap-fill layer 56 comprises mainly amorphous silicon, with a small percentage, for example, less than 10 percent polysilicon therein. Since crystalline silicon has a thermal conductivity much higher than, for example, about 100 times higher than, the thermal conductivity of amorphous silicon, incorporating even a small amount of polysilicon in the amorphous silicon of gap-fill layer 56 may significantly improve the thermal conductivity of gap-fill layer 56, for example, to be greater than about 5 watt/m-k or higher.

In accordance with some embodiments in which gap-fill layer 56 comprises polycrystalline silicon, the polycrystalline silicon may be polycrystalline islands (particles) fully enclosed in, and separated by, the amorphous silicon. The generation of small amount of polysilicon may be achieved, for example, by slightly increasing the deposition temperature of gap-fill layer 56, reducing the deposition rate, and/or the like. The generation of small amount of polysilicon may also be achieved by annealing gap-fill layer 56 after deposition, for example, after the process shown in FIG. 4 or FIG. 5.

In accordance with some embodiments, gap-fill layer 56 is deposited using Physical Vapor Deposition (PVD), Chemical Vapor Deposition (CVD), Plasma Enhanced Chemical Vapor Deposition (PECVD), and/or the like.

Using amorphous silicon to form gap-fill layer 56 has some advantageous features. The thermal conductivity is relatively high, and hence heat may dissipate more efficiently through gap-fill layer 56 to other features such as a heat sink. Also, the coefficient of thermal expansion (CTE) of amorphous silicon is closer to that of semiconductor substrate 22 than other materials. Accordingly, the stress and the warpage in the resulting package is reduced.

In accordance with alternative embodiments in which gap-fill layer 56 comprises a semiconductor material, gap-fill layer 56 may be formed of or comprises a III-V semiconductor, which may be formed or comprises GaAs, InP, GaN, InN, and/or the like, or combinations thereof. The III-V semiconductors may have high thermal conductivity values. For example, GaAs may have a thermal conductivity equal to about 52 watt/m-k, InP may have a thermal conductivity equal to about 68 watt/m-k, GaN may have a thermal conductivity equal to about 130 watt/m-k, GaP may have a thermal conductivity equal to about 110 watt/m-k, and InN may have a thermal conductivity in the range between about 45 watt/m-k and about 175 watt/m-k. Accordingly, III-V compound semiconductors may have very high thermal conductivity values compared to that of silicon oxide.

In accordance with some embodiments, the III-V compound semiconductor that forms gap-fill layer 56 may be undoped with the impurities that cause it to be n-type and/or p-type. Accordingly, gap-fill layer 56 may be intrinsic or unintentionally doped. This will keep the electrical conductivity value, and hence the leakage current through it, if any, to be low.

In accordance with alternative embodiments, gap-fill layer 56 is formed of or comprises a dielectric material, which also has a higher thermal conductivity than silicon oxide. For example, gap-fill layer 56 may be formed of silicon-based dielectrics such as silicon carbide, silicon oxynitride, silicon oxy-carbo-nitride, or the like. The thermal conductivity value of the dielectric material may be greater than about 1.5 watt/m-k, and may be in the range between about 1.5 watt/m-k and about 10 watt/m-k. The corresponding gap-fill layer 56 may also have an amorphous structure.

In accordance with alternative embodiments, gap-fill layer 56 has a multi-layer structure including a plurality of layers. For example, FIG. 4 illustrates that an example gap-fill layer 56 may include sub layers 56A, 56B, 56C, and 56D, which are also collectively referred to as sub layers 56. In accordance with various embodiments, gap-fill layer 56 may include two sub layers, three sub layers, four sub layers, five sub layers, or more. In accordance with some embodiments, neighboring sub layers 56 are formed of different materials. The sub layers that are not in contact with each other may be formed of a same material or different materials. In accordance with some embodiments, sub layers 56A and 56C are formed of a same material, and/or sub layers 56B and 56D are formed of a same material. In accordance with alternative embodiments, sub layers 56A and 56C are formed of different materials, and/or sub layers 56B and 56D are formed of different materials.

In accordance with some embodiments in which gap-fill layer 56 has a multi-layer structure, the dielectric sub layers (if any) in gap-fill layer 56 may include silicon oxide, silicon nitride, silicon oxynitride, amorphous silicon carbide, silicon oxycarbide, and/or the like. The semiconductor sub layers (if any) in gap-fill layer 56 may include amorphous silicon (with or without small polycrystalline islands therein), or may include a III-V semiconductor material such as GaAs, InP, GaN, GaP, InN, or the like, or combinations thereof.

Also, the sub layers may have mixed structure including a semiconductor layer(s) and a dielectric layer(s). For example, sub layer 56A or 56B may be a dielectric layer (and having low leakage), while sub layer 56B or 56C may be a semiconductor layer that has a high thermal conductivity.

In accordance with some embodiments, as shown in FIG. 4, lower sub layers 56A, 56B, and 56C are conformal layers, which may be formed through ALD, CVD, or the like. The top sub layer such as sub layer 56D may be conformal or non-conformal. In accordance with alternative embodiments, some or all of the sub layers in gap-fill layer are non-conformal. This may be achieved through bottom-up deposition such as Flowable Chemical Vapor Deposition (FCVD), spin-on coating, or the like.

Forming gap-fill layer 56 as having a multi-layer structure have some advantageous features. For example, the requirement of having low leakage current and high thermal conductivity can both be met by adopting sub layers. In an example embodiment, some sub layers such as 56A and/or 56C are formed of dielectric materials having low leakage currents, and hence act as leakage barriers. Other sub layers such as 56B and/or 56D may be formed of a material(s) with high thermal conductivities. The dielectric materials may have small thicknesses so that its effect to the thermal conductivity is small. The high-thermal-conductivity layer(s) may have greater thicknesses greater than the thickness of the leakage barriers, so that the resulting gap-fill layer 56 has an overall higher thermal resistance.

The materials and the thicknesses of the sub layers may be adjusted, so that the stress in the resulting gap-fill layer 56 is reduced. In accordance with some embodiments, sub layer 56A is a dielectric layer formed of a silicon-containing dielectric material, the bottom horizontal portion of sub layer 56A may have a top surface 56A-T, which is level with or substantially level with (for example, with a variation smaller than about 0.1 μm) the bottom surface 44-B of substrate 44. The overlying sub layers 56B, 56C, and 56D, instead of being multiple layers, may be formed as a single layer instead. The single layer may be formed of amorphous silicon. Accordingly, the gap-fill layer 56 may have a similar structure as device die 42, with a silicon region and a dielectric region underlying the silicon region. This structure will have significantly reduced stress and warpage.

Figure 5:
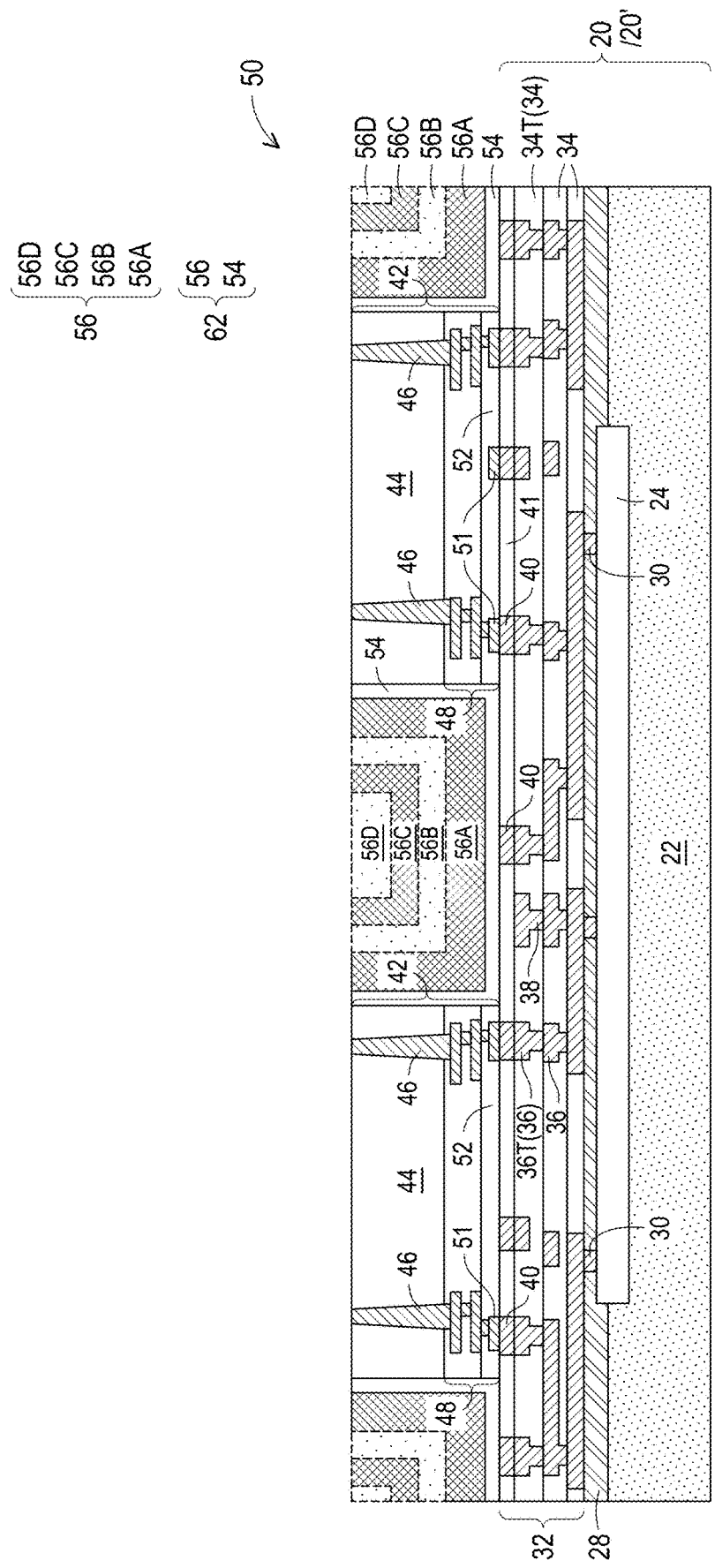

Referring to FIG. 5, a planarization process such as a CMP process or a mechanical grinding process is performed to remove excess portions of gap-fill layer 56 and dielectric liner 54, so that semiconductors 44 of device dies 42 are exposed. The respective process is illustrated as process 210 in the process flow 200 as shown in FIG. 15. Also, the top surfaces of through-vias 46 are exposed. The remaining portions of dielectric liner 54 and gap-fill layer 56 are collectively referred to as gap-fill regions 62 or isolation regions 62.

Figure 6:
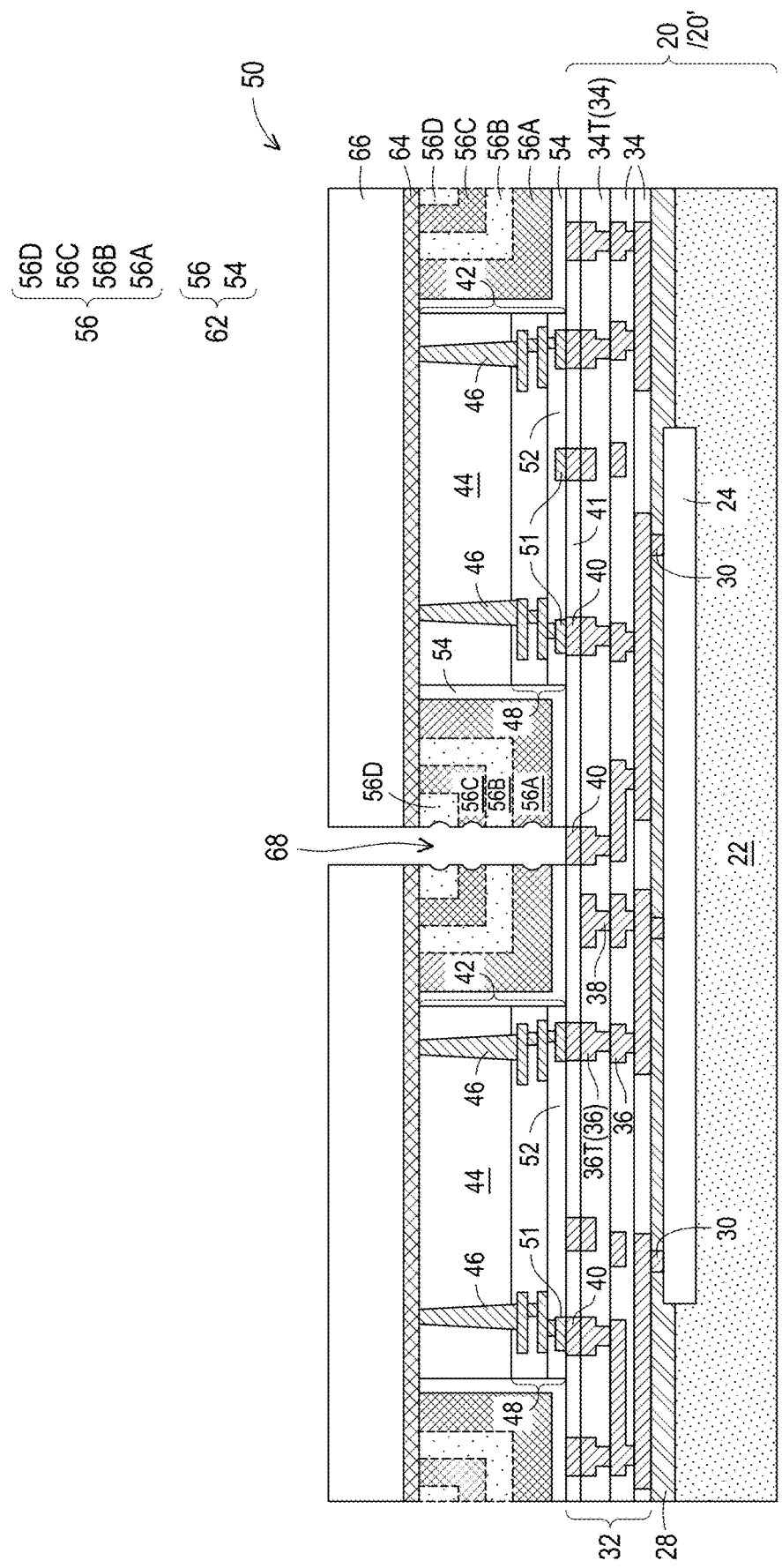

FIG. 6 through 9 illustrate the formation of through-via 72, which penetrates through gap-fill region 62. Referring to FIG. 6, Bottom Anti-Reflective Coating (BARC) 64 and photoresist 66 are formed. In accordance with some embodiments, BARC 64 may be formed of a cross-linked photoresist, an SiON layer, or the like. Photoresist 66 is patterned, and is used to etch BARC 64, followed by the etching of gap-fill region 62.

In accordance with some embodiments, the etching of gap-fill region 62 is performed through a Bosch process. The Bosch process may include etching a top portion of the gap-fill region 62 to form an opening 68, forming a first protection layer on the sidewall of the opening 68, further etching the gap-fill region 62 to extend opening 68 down, forming a second protection layer on the sidewall of the opening 68, and etching the gap-fill region 62 to extend opening 68 down. The protection layers may be formed of polymers, an inorganic dielectric material, or the like. The process is repeated until opening 68 extends to dielectric liner 54. The protection layers are then removed, resulting in the structure shown in FIG. 6. Dielectric liner 54 is thus exposed. Opening 68 is thus formed. The respective process is illustrated as process 212 in the process flow 200 as shown in FIG. 15.

In the etching process, dielectric liner 54 may act as an etch stop layer. Another etching process is then performed to etch-through dielectric liner 54, exposing the underlying bond pad 40.

In accordance with some embodiments, by using the Bosch process, the etching rate is increased, for example, to a range between about 3 μm and about 100 μm. This improves the throughput. When the Bosch process is used, the resulting opening 68 may have a plurality of lateral protrusions between the vertical-and-straight portions of the sidewalls. In accordance with alternative embodiments, the etching is performed without using Bosch process (without forming protection layers in opening 68 and lining sidewalls of gap-fill region 62). The sidewalls of gap-fill region 62 facing opening 68 may thus be straight. Photoresist 66 is removed after the etching process.

In accordance with alternative embodiments in which gap-fill regions 62 comprise a plurality of sub layers 56, the lower sub layers may be used as the etch stop layers of the respective overlying sub layer(s). For example, sub layer 56A may be used as the etch stop layer for the etching of sub layer 56B, or the etch stop layer for etching sub layers 56B, 56C, and 56D. Sub layer 56B may be used as the etch stop layer for the etching of sub layer 56C, or the etch stop layer for etching sub layers 56C and 56D.

Figure 7:
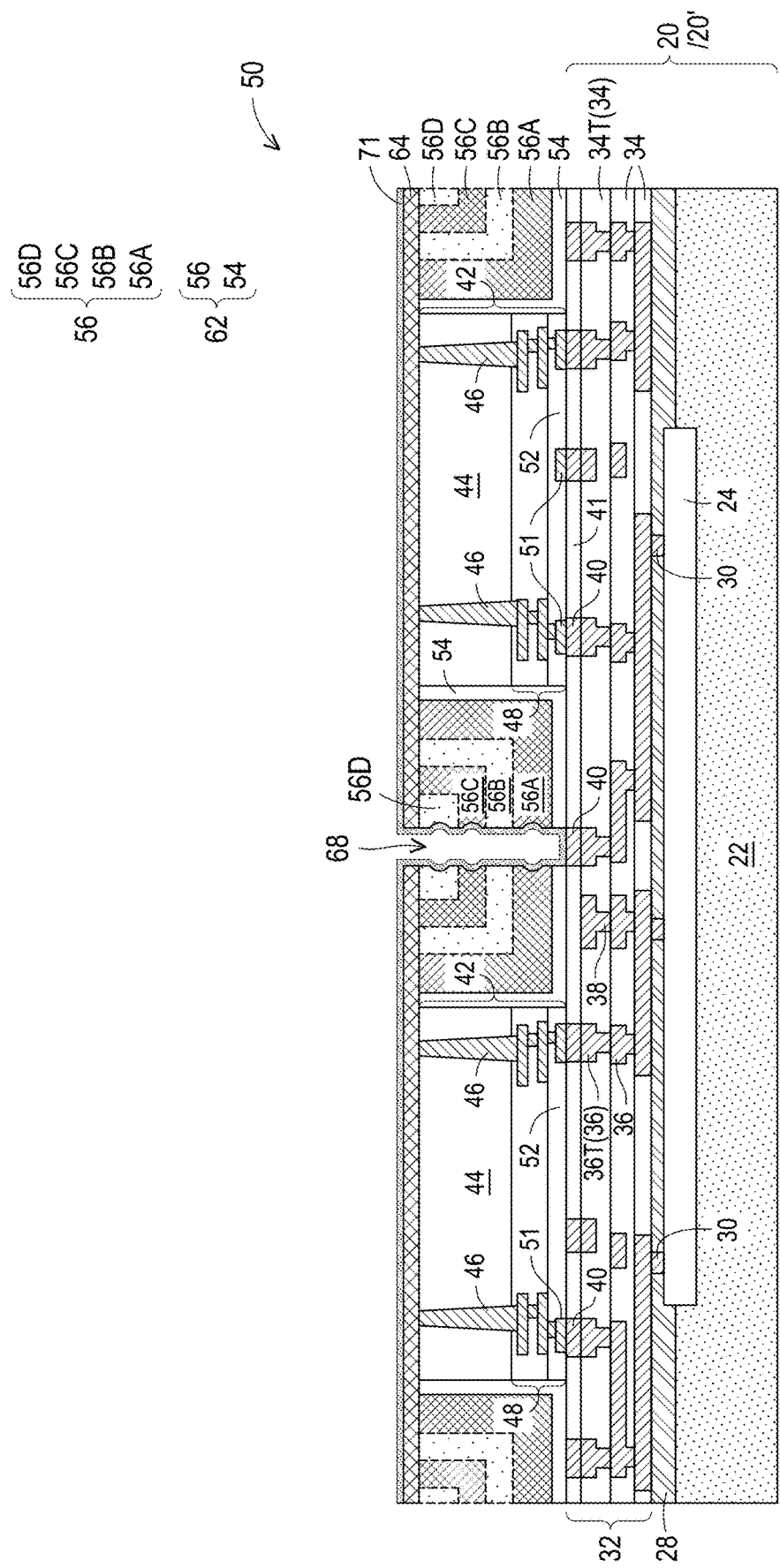

Next, as shown in FIG. 7, a dielectric liner 71 is formed lining opening 68. The respective process is illustrated as process 214 in the process flow 200 as shown in FIG. 15. Dielectric liner 71 may be formed of silicon nitride, silicon oxide, silicon oxynitride, silicon oxycarbide, or the like. Dielectric liner 71 may be formed as a conformal layer, which may be formed through ALD, CVD, or the like.

Figure 8:
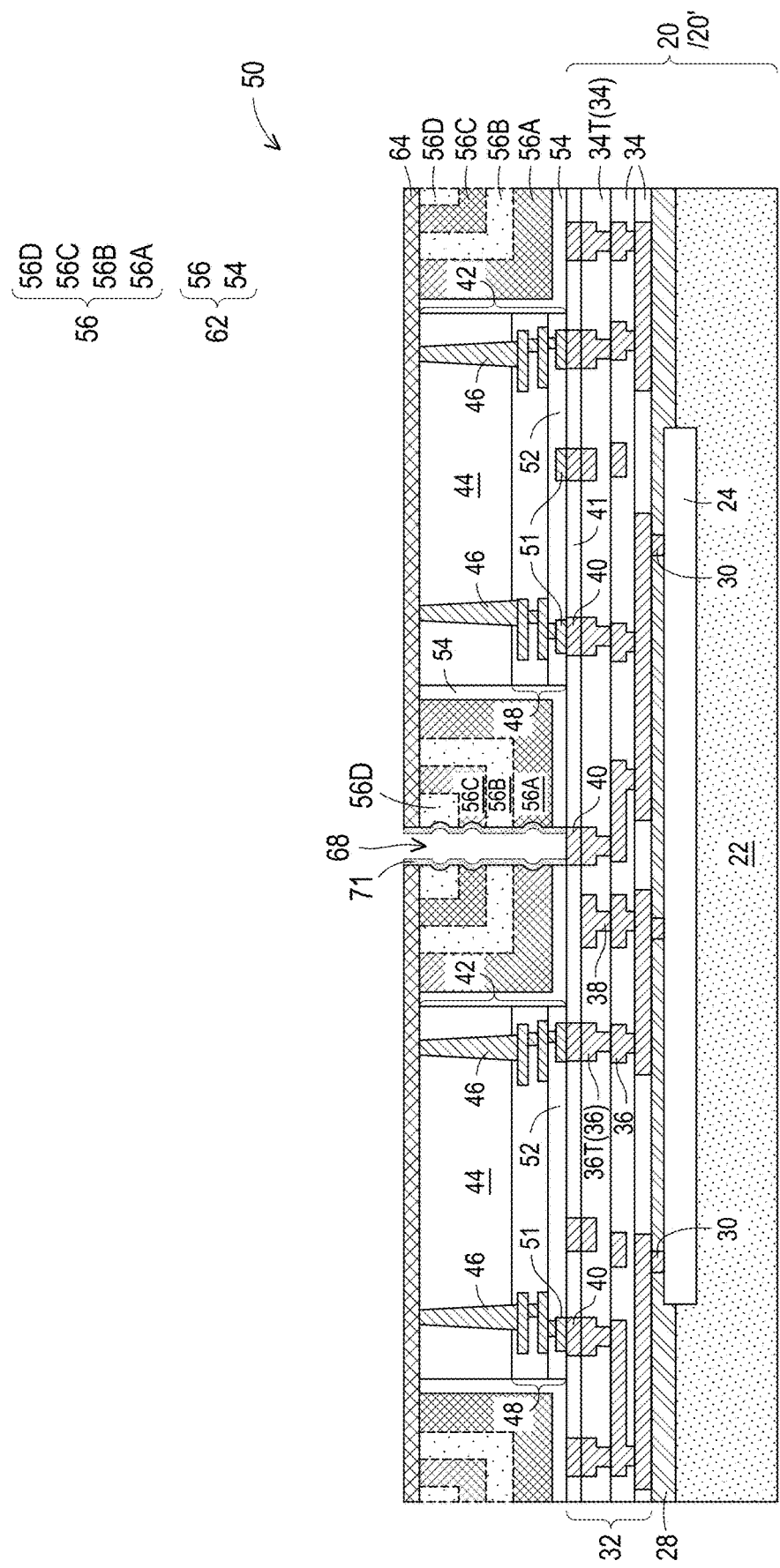

FIG. 8 illustrates the removal of the horizontal portions of dielectric liner 71, for example, through an anisotropic etching process. The respective process is illustrated as process 216 in the process flow 200 as shown in FIG. 15.

Figure 9:
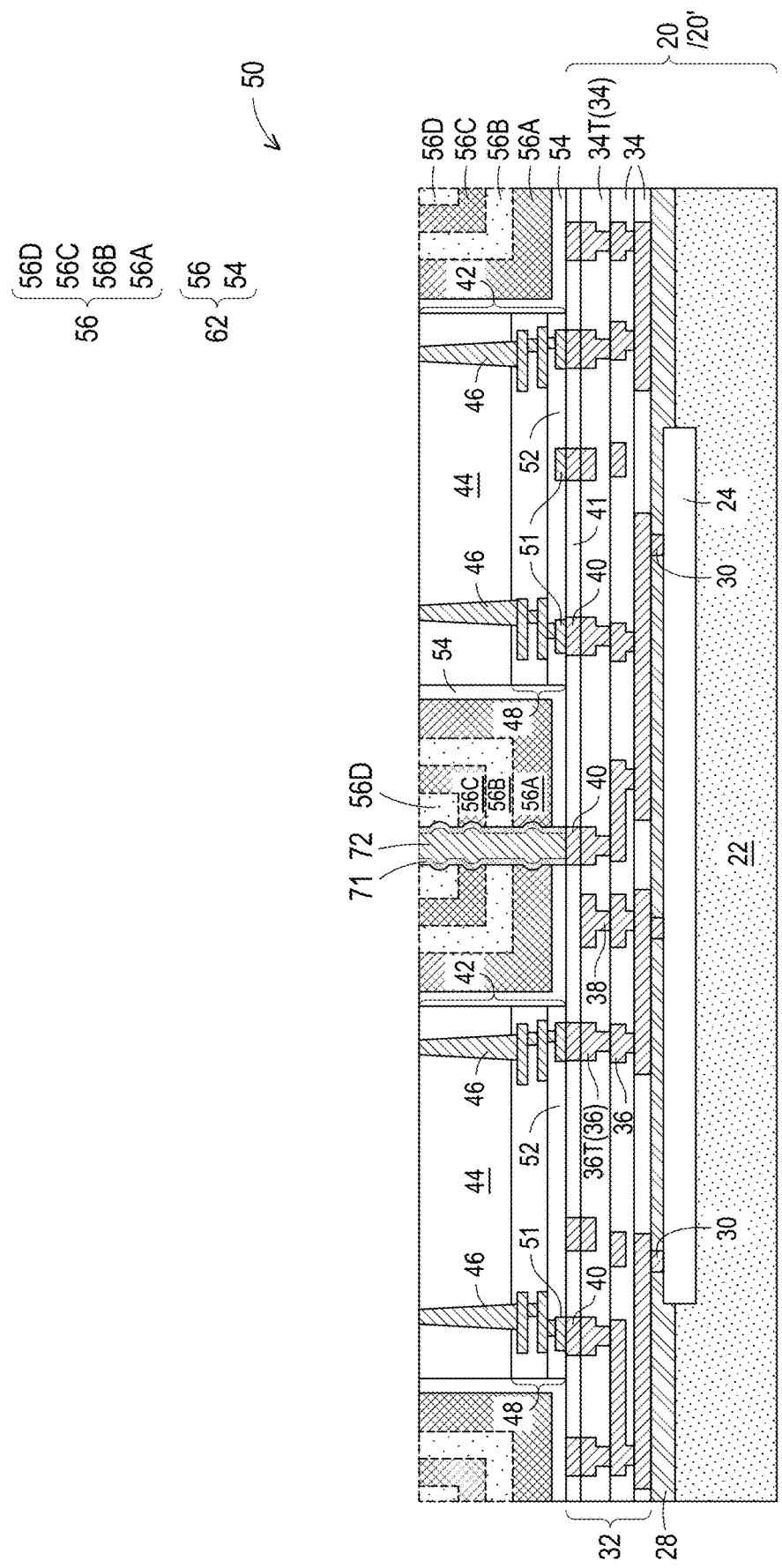

In a subsequent process, as shown in FIG. 9, a conductive material is filled into opening 68, followed by a planarization process to remove excess portions of the conductive material, forming through-via 72. The respective process is illustrated as process 218 in the process flow 200 as shown in FIG. 15. In accordance with alternative embodiments, no through-via is formed in gap-fill regions 62.

Figure 10:
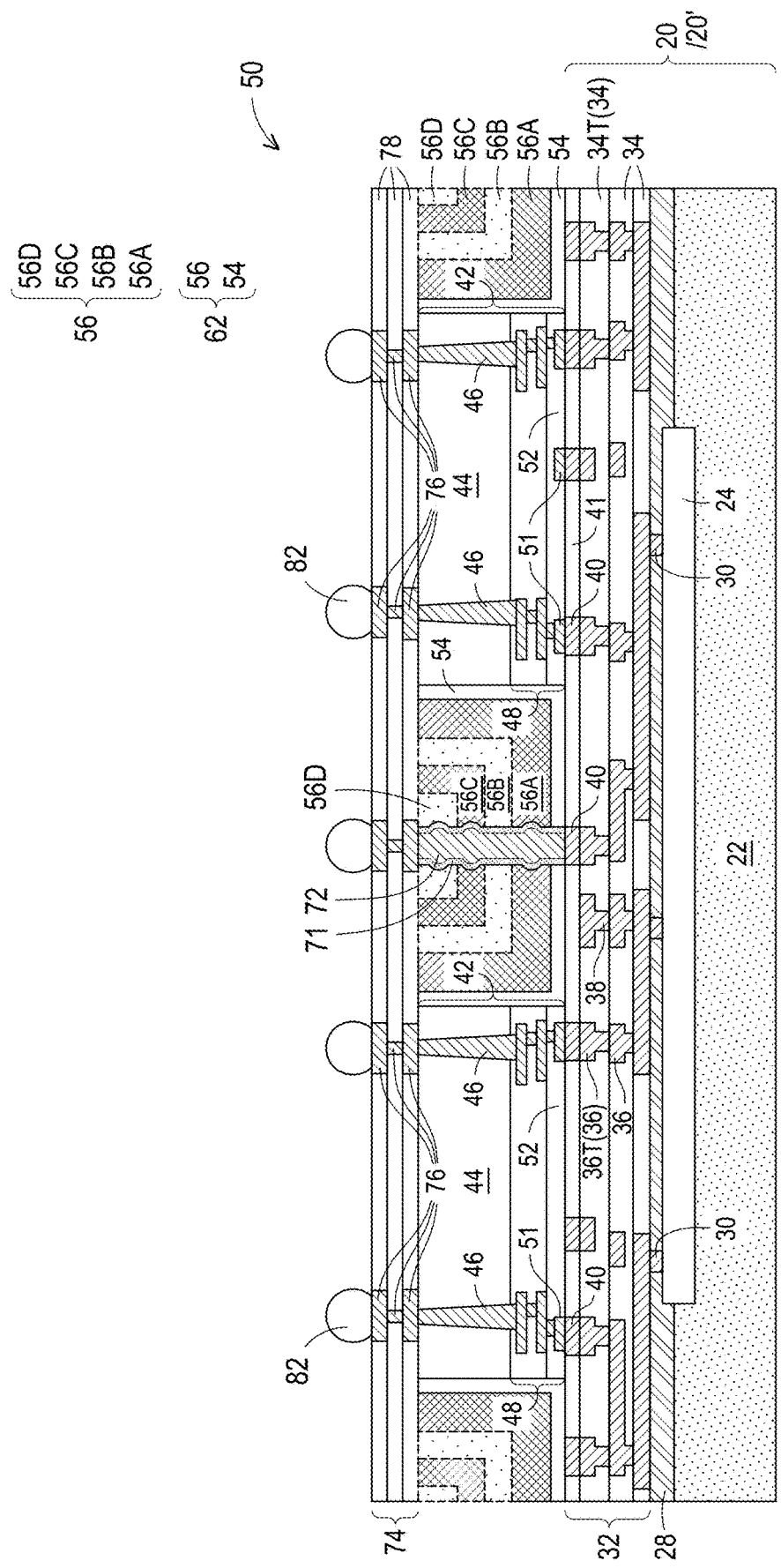

Referring to FIG. 10, a (backside) interconnect structure 74 is formed on the backside of device dies 42. The respective process is illustrated as process 220 in the process flow 200 as shown in FIG. 15. Interconnect structure 74 includes redistribution lines (RDLs) 76 (which also include metal pads) and dielectric layers 78. In accordance with some embodiments, dielectric layer 78 is formed of an oxide such as silicon oxide, a nitride such as silicon nitride, or the like. RDLs 76 may be formed using damascene processes, which includes etching dielectric layer 78 to form openings, depositing a conductive barrier layer into the openings, plating a metallic material such as copper or a copper alloy, and performing a planarization process to remove excess portions of RDLs 76. Alternatively, RDLs 76 may be formed through plating processes.

Electrical connectors 82 are formed on interconnect structure 74, and are electrically connected to device dies 42 and possibly through-vias 72 through RDLs 76. In accordance with some embodiments, electrical connectors 82 comprise solder regions, metal bumps, and/or the like. Reconstructed wafer 50 is thus formed.

Figure 11:
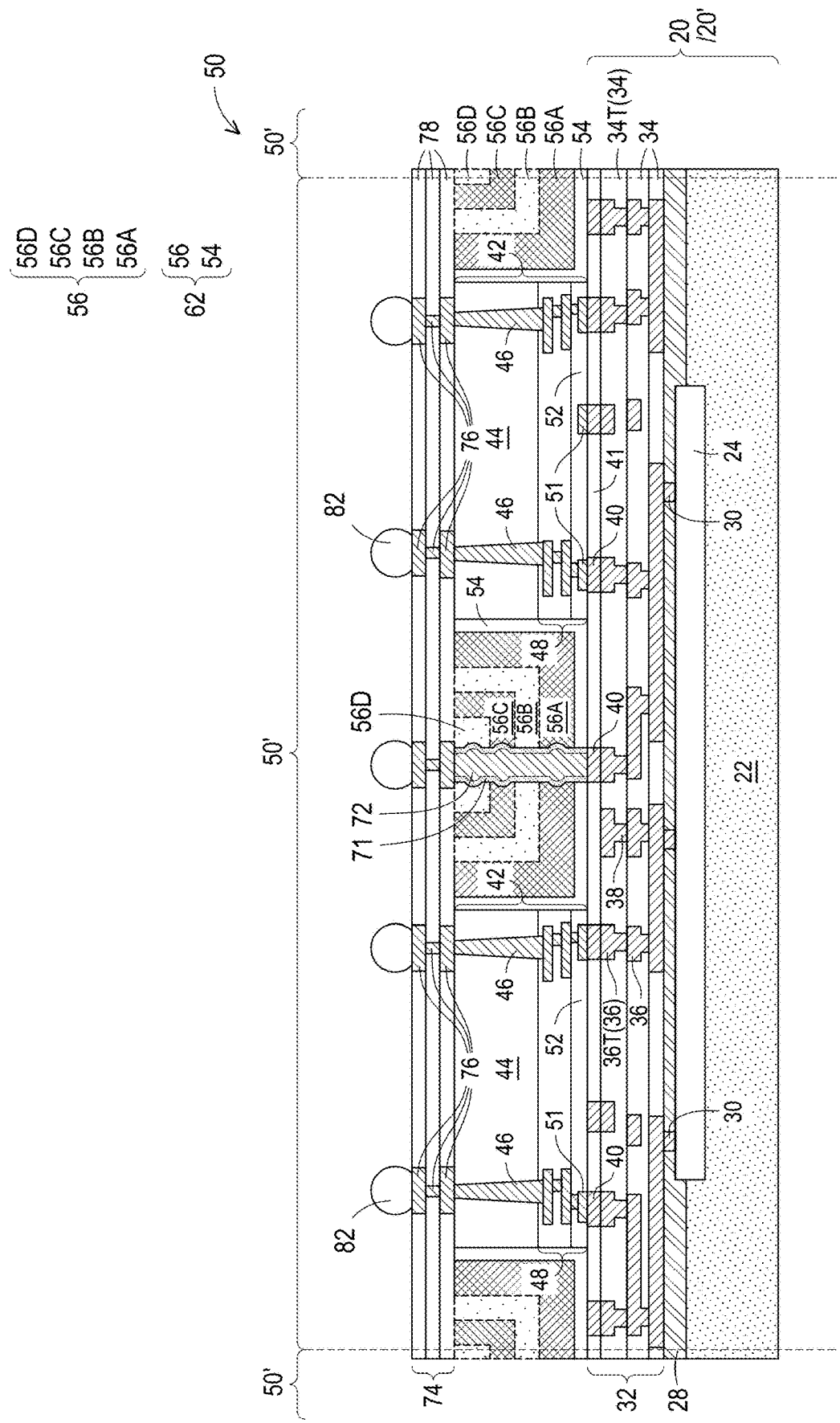

In subsequent processes, as shown in FIG. 11, reconstructed wafer 50 is singulated in a sawing process, so that discrete packages 50' are formed. The respective process is illustrated as process 222 in the process flow 200 as shown in FIG. 15. The discrete packages 50' may include device dies 20' and 42.

Figure 12:
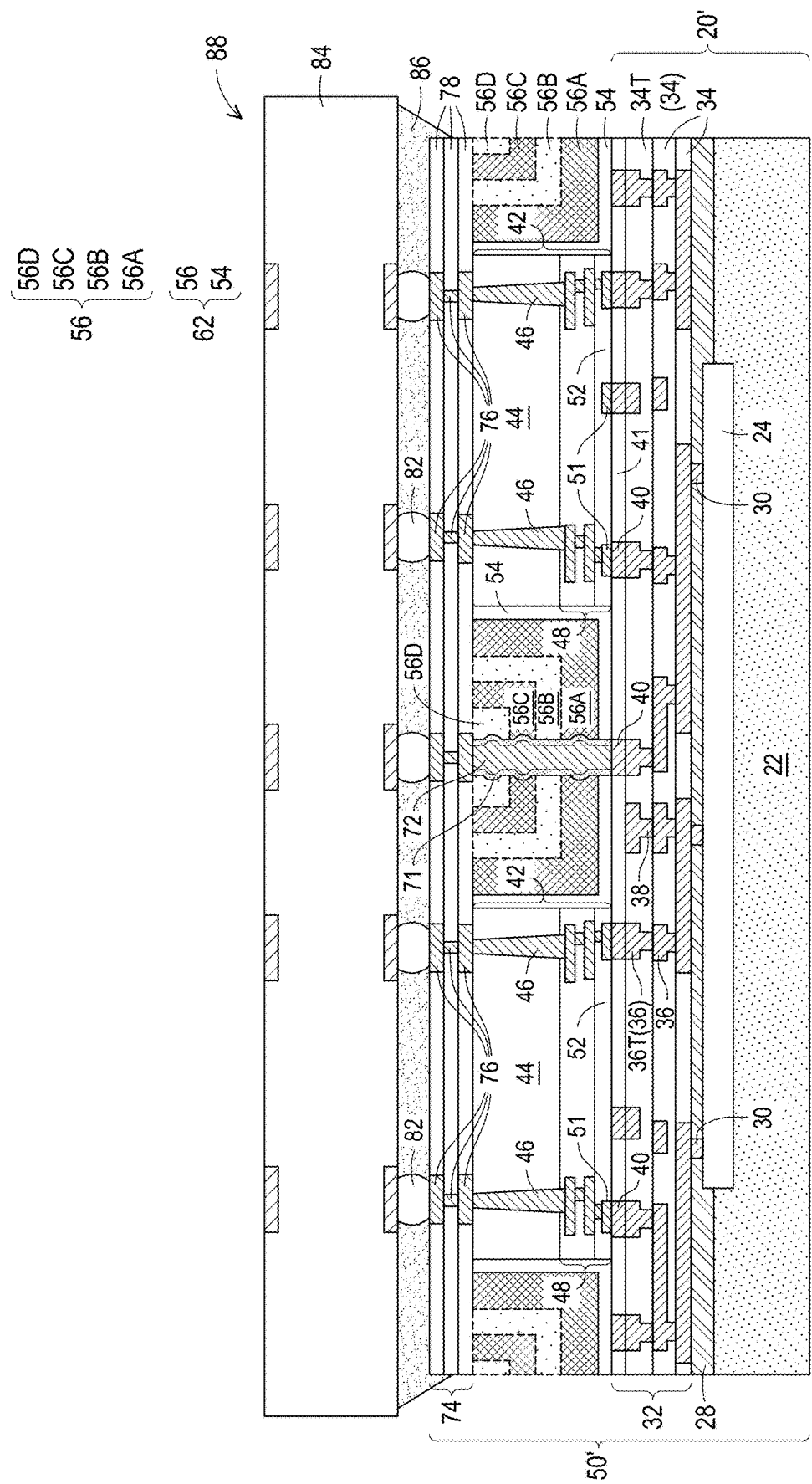

FIG. 12 illustrates the bonding of package 50' to package component 84 in accordance with some embodiments. The respective process is illustrated as process 224 in the process flow 200 as shown in FIG. 15. Package component 84 may be an interposer, a package substrate, a package including device dies therein, or the like. Underfill 86 may be dispensed in the gap between package 50' and package component 84. Package 88 is thus formed.

In the structure as shown in FIG. 12, through-via 72 may have a plurality of lateral protrusion portions protruding laterally beyond the vertical-and-straight sidewalls of the overlying portions of through-via 72. The protrusion portions are caused due to the formation of the protection layers in the Bosch process. In accordance with some embodiments, the positions of the protrusion portions may be at any height of the through-via 72, depending on the positions of stop etching in order to form protection layers.

In the structure shown in FIG. 12, the heat generated in device die 20' may pass through device dies 42 and gap-fill regions 62, and dissipate to package component 84. With the gap-fill layer 56 having a high thermal conductivity, more heat can be dissipated through gap-fill regions 62.

In accordance with alternative embodiments, a heat sink may be under and attached to device die 20'. Accordingly, with gap-fill regions 62 having a high thermal conductivity value, the heat generated in device dies 42 may dissipate to gap-fill regions 62, and from gap-fill regions 62 into device die 20' and to the heat sink. Due to the high thermal conductivity value of gap-fill layer 56, the thermal resistance in this heat dissipation path is reduced. Accordingly, in addition to the heat path from device dies 42 directly into device die 20' and to the heat sink, another heat dissipation path through gap-fill regions 62 also has reduced thermal resistance.

Figure 13:
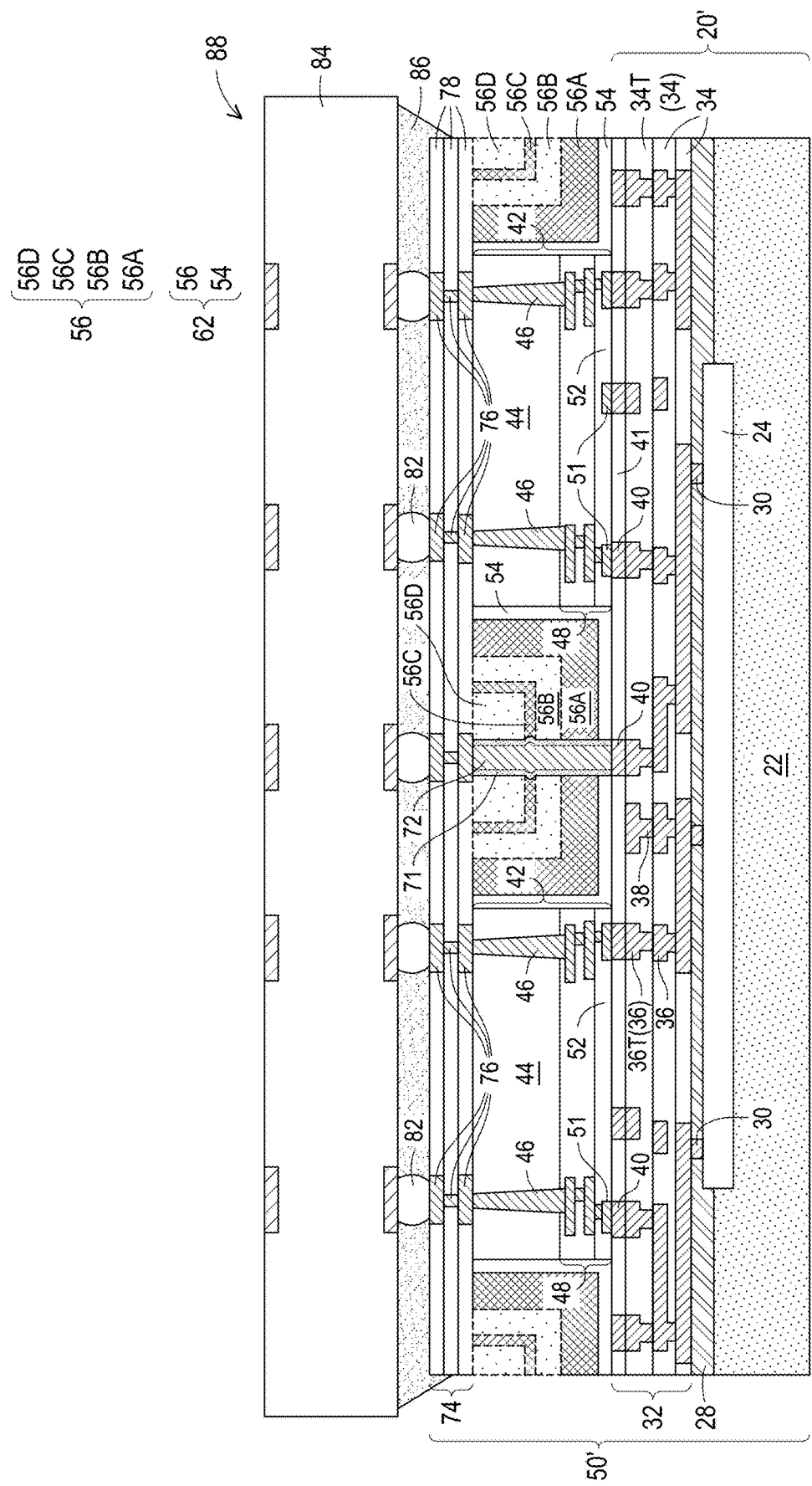
FIGS. 13 and 14 illustrate the packages with improved gap-fill structures in accordance with alternative embodiments.

FIG. 13 illustrates package 88 formed in accordance with alternative embodiments. In accordance with these embodiments, gap-fill regions 62 may have a multi-layer structure, in which some sub layers are used as etch stop layers for etching the overlying sub layer(s). For example, sub layer 56C may be used as an etch stop layer, which may be etched through an isotropic etch process (which may be a dry etch process or a wet etch process). There may be undercuts formed in the etch stop layer, and accordingly, through-via 72 has protrusion portions laterally extending into the etch stop layer, while the portions in the overlying and underlying layers do not have lateral protrusion portions. The materials and the structures of the sub layers have been discussed referring to preceding embodiments.

Figure 14:
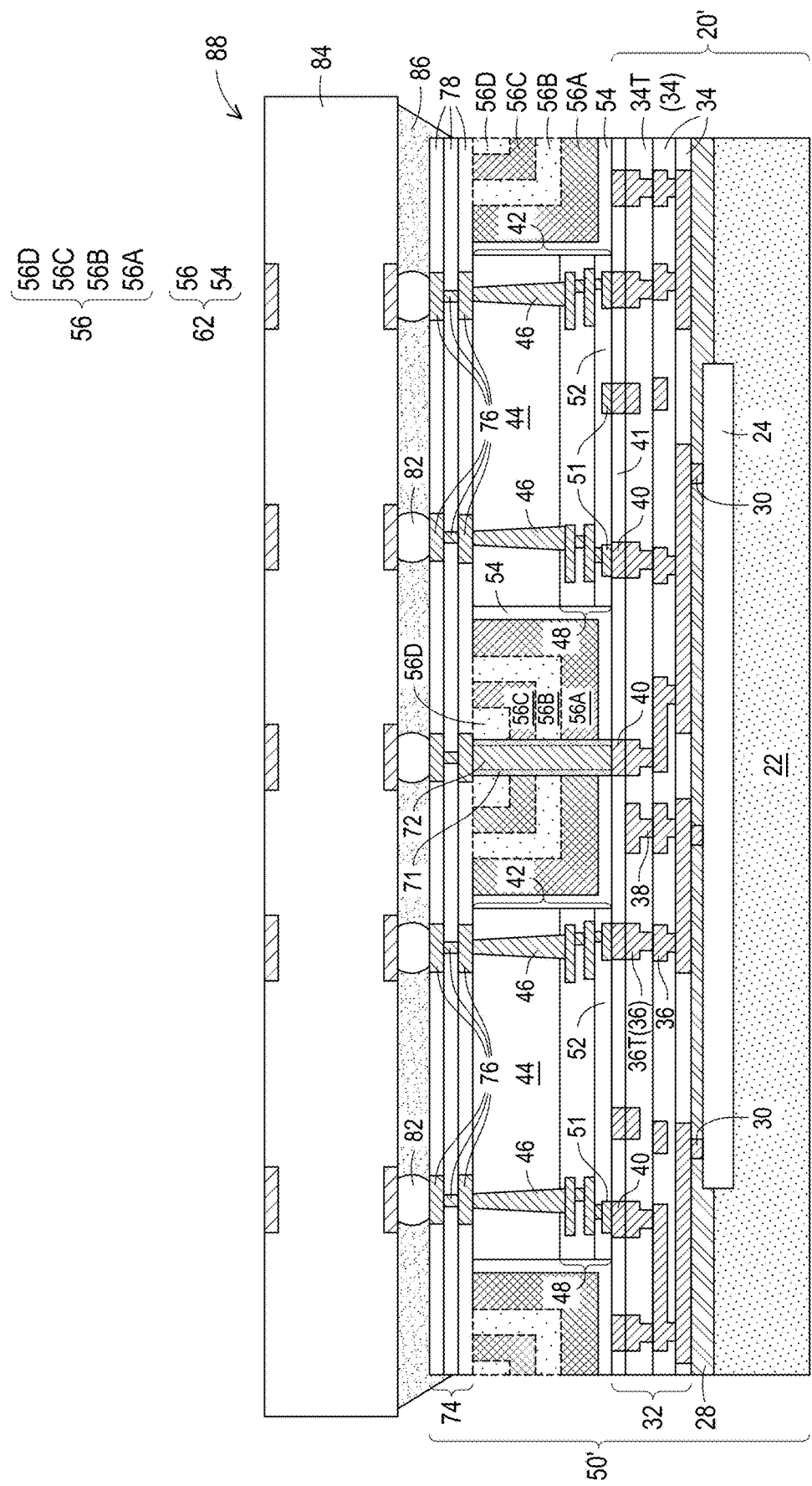

FIG. 14 illustrates package 88 formed in accordance with yet alternative embodiments. In accordance with these embodiments, through-via 72 may have straight edges. In the formation of the respective opening 68 (FIG. 6), a same etching gas that is configured to etch all sub layers 56 may be used, and no Bosch process is used. Accordingly, the sidewalls of gap-fill regions 62 facing opening 68 may be straight. The resulting through-via 72 also has straight edges, as shown in FIG. 14.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming isolation regions with high thermal conductivity values, the heat dissipation through the isolation regions is improved. The materials and the structure of the isolation regions are selected, so that the stress and the warpage of the resulting packages are also reduced.

In accordance with some embodiments of the present disclosure, a method comprises bonding a top die to a bottom die; depositing a first dielectric liner on the top die; depositing a gap-fill layer on the first dielectric liner, wherein the gap-fill layer has a first thermal conductivity value higher than a second thermal conductivity value of silicon oxide; etching the gap-fill layer and the first dielectric liner to form a through-opening, wherein a metal pad in the bottom die is exposed to the through-opening; depositing a second dielectric liner lining the through-opening; filling the through-opening with a conductive material to form a through-via connecting to the metal pad; and forming a redistribution structure over and electrically connecting to the top die and the through-via.

In an embodiment, the depositing the gap-fill layer comprises depositing a first sub layer comprising a first material; and depositing a second sub layer over the first sub layer, wherein the second sub layer comprises a second material different from the first material. In an embodiment, a first one of the first sub layer and the second sub layer comprises amorphous silicon, and a second one of the first sub layer and the second sub layer comprises a dielectric material. In an embodiment, the gap-fill layer comprises a first plurality of sub layers and a second plurality of sub layers stacked alternatingly, wherein the first plurality of sub layers comprise the first material, and the second plurality of sub layers comprise the second material.

In an embodiment, the etching the gap-fill layer comprises etching the second sub layer, with the first sub layer being used as an etch stop layer. In an embodiment, the etching the gap-fill layer is performed through a Bosch process. In an embodiment, the etching the gap-fill layer is performed without stopping until the first dielectric liner is exposed. In an embodiment, the depositing the gap-fill layer comprises depositing an amorphous silicon layer. In an embodiment, the depositing the gap-fill layer comprises depositing an amorphous silicon-based dielectric layer. In an embodiment, the depositing the gap-fill layer comprises depositing a III-V compound semiconductor layer.

In accordance with some embodiments of the present disclosure, a structure comprises a bottom die; a top die over and bonding to the bottom die, wherein the top die comprises a top metal pad; a dielectric liner comprising a vertical portion on sidewalls of the top die, and a horizontal portion on the bottom die; a gap-fill layer overlapping the horizontal portion of the dielectric liner, wherein the gap-fill layer has a first thermal conductivity value higher than a second thermal conductivity value of silicon dioxide; a through-via penetrating through the dielectric liner and the gap-fill layer, wherein the through-via contacts the top metal pad; and a redistribution structure over and electrically coupling to the top die and the through-via.

In an embodiment, the gap-fill layer comprises an amorphous silicon-based dielectric material. In an embodiment, the gap-fill layer comprises a semiconductor material. In an embodiment, the gap-fill layer comprises a first sub layer comprising a first material; and a second sub layer over the first sub layer, wherein the second sub layer comprises a second material different from the first material. In an embodiment, a first one of the first sub layer and the second sub layer comprises a semiconductor, and a second one of the first sub layer and the second sub layer comprises a dielectric material. In an embodiment, the through-via comprises a plurality of lateral protrusions.

In accordance with some embodiments of the present disclosure, a structure comprises a bottom die; a top die over and bonding to the bottom die; a first dielectric liner comprising a first portion on sidewalls of the top die, and a second portion on a top surface of the bottom die; a gap-fill layer contacting the first dielectric liner, wherein the gap-fill layer comprises a first sub layer comprising a semiconductor material; a through-via penetrating through the first dielectric liner and the gap-fill layer; and a second dielectric liner encircling the through-via, wherein the second dielectric liner electrically insulates the through-via from the gap-fill layer. In an embodiment, the semiconductor material of the gap-fill layer comprises a III-V compound semiconductor material. In an embodiment, the semiconductor material of the gap-fill layer comprises amorphous silicon. In an embodiment, the gap-fill layer further comprises a second sub layer contacting the first sub layer, and wherein the second sub layer is formed of a different material than the first sub layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a top die to a bottom die;
   depositing a first dielectric liner on the top die;
   depositing a gap-fill layer on the first dielectric liner, wherein the gap-fill layer has a first thermal conductivity value higher than a second thermal conductivity value of silicon oxide, wherein the depositing the gap-fill layer comprises:
      depositing a first sub layer comprising a first material; and
      depositing a second sub layer over the first sub layer, wherein the second sub layer comprises a second material different from the first material;
   etching the gap-fill layer and the first dielectric liner to form a through-opening, wherein a metal pad in the bottom die is exposed to the through-opening, wherein the etching the gap-fill layer comprises etching the second sub layer, with the first sub layer being used as an etch stop layer;
   depositing a second dielectric liner lining the through-opening;
   filling the through-opening with a conductive material to form a through-via connecting to the metal pad; and
   forming a redistribution structure over and electrically connecting to the top die and the through-via.

2. The method of claim 1, wherein a first one of the first sub layer and the second sub layer comprises amorphous silicon, and a second one of the first sub layer and the second sub layer comprises a dielectric material.

3. The method of claim 1, wherein the gap-fill layer comprises a first plurality of sub layers and a second plurality of sub layers stacked alternatingly, wherein the first plurality of sub layers comprise the first material, and the second plurality of sub layers comprise the second material.

4. The method of claim 1, wherein the etching the gap-fill layer is performed through a Bosch process.

5. The method of claim 1, wherein the etching the gap-fill layer is performed without stopping until the first dielectric liner is exposed.

6. The method of claim 1, wherein the depositing the gap-fill layer comprises depositing an amorphous silicon layer.

7. The method of claim 1, wherein the depositing the gap-fill layer comprises depositing an amorphous silicon-based dielectric layer.

8. The method of claim 1, wherein the depositing the gap-fill layer comprises depositing a III-V compound semiconductor layer.

9. The method of claim 1, wherein the depositing the gap-fill layer comprises:
   depositing a third sub layer over the second sub layer, wherein the third sub layer comprises a third material different from the second material.

10. The method of claim 9, wherein the third material is same as the first material.

11. The method of claim 1, wherein the through-via comprises a lateral protrusion.

12. A method comprising:
   bonding a top die over a bottom die, wherein the top die comprises a top metal pad;
   forming a dielectric liner comprising a vertical portion on sidewalls of the top die, and a horizontal portion on the bottom die;
   depositing a gap-fill layer overlapping the horizontal portion of the dielectric liner, wherein the gap-fill layer has a first thermal conductivity value higher than a second thermal conductivity value of silicon dioxide;

forming a through-via penetrating through the dielectric liner and the gap-fill layer, wherein the through-via contacts the top metal pad, and wherein the through-via comprises a plurality of lateral protrusions; and forming a redistribution structure over and electrically coupling to the top die and the through-via.

13. The method of claim 12, wherein the depositing the gap-fill layer comprises depositing an amorphous silicon-based dielectric material.

14. The method of claim 12, wherein the depositing the gap-fill layer comprises depositing a semiconductor material.

15. The method of claim 12, wherein the depositing the gap-fill layer comprises:

depositing a first sub layer comprising a first material; and depositing a second sub layer over the first sub layer, wherein the second sub layer comprises a second material different from the first material.

16. The method of claim 15, wherein a first one of the first sub layer and the second sub layer comprises a semiconductor, and a second one of the first sub layer and the second sub layer comprises a dielectric material.

17. The method of claim 12, wherein the gap-fill layer comprises:

a first plurality of sub layers comprising a same first dielectric material; and a second plurality of sub layers comprising a same second dielectric materials different from the same first dielectric material, wherein the first plurality of sub layers and the second plurality of sub layers are allocated alternatingly.

18. A method comprising:

bonding a top die over a bottom die;

depositing a first dielectric liner comprising a first portion on sidewalls of the top die, and a second portion on a top surface of the bottom die;

forming a gap-fill layer contacting the first dielectric liner, wherein the forming the gap-fill layer comprises depositing a first sub layer comprising amorphous silicon;

forming a through-via penetrating through the first dielectric liner and the gap-fill layer; and forming a second dielectric liner, wherein the second dielectric liner encircles the through-via, and wherein the second dielectric liner electrically insulates the through-via from the gap-fill layer.

19. The method of claim 18, wherein the through-via comprises a plurality of lateral protrusions.

20. The method of claim 18, wherein the forming the gap-fill layer further comprises forming a second sub layer contacting the first sub layer, and wherein the second sub layer is formed of a different material than the first sub layer.

* * * * *